United States Patent
Raman et al.

(10) Patent No.: US 10,082,847 B2
(45) Date of Patent: Sep. 25, 2018

(54) METHOD AND SYSTEM FOR OPTIMIZING PERFORMANCE OF A PCD WHILE MITIGATING THERMAL GENERATION

(71) Applicant: QUALCOMM INCORPORATED, San Diego, CA (US)

(72) Inventors: Vijay Raman, Fort Collins, CO (US); Amy Derbyshire, Boulder, CO (US); Christopher Medrano, Longmont, CO (US); Shiju Abraham Mathew, Scarborough (CA); Ronald Frank Alton, Oceanside, CA (US); Jon James Anderson, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 674 days.

(21) Appl. No.: 14/289,675

(22) Filed: May 29, 2014

(65) Prior Publication Data

US 2015/0277395 A1 Oct. 1, 2015

Related U.S. Application Data

(60) Provisional application No. 61/973,772, filed on Apr. 1, 2014.

(51) Int. Cl.
*G06F 1/20* (2006.01)
*G05B 11/42* (2006.01)
(Continued)

(52) U.S. Cl.
CPC .............. *G06F 1/206* (2013.01); *G05B 11/42* (2013.01); *G06F 1/203* (2013.01); *G06F 1/3203* (2013.01);
(Continued)

(58) Field of Classification Search
CPC ........ G06F 1/203; G06F 1/206; G06F 1/3203; G06F 1/324; G06F 1/3296; H01L 23/34; H01L 23/345
See application file for complete search history.

(56) References Cited

U.S. PATENT DOCUMENTS 6,110,289 A * 8/2000 Moore ................ C23C 16/4588
118/666
6,783,080 B2 * 8/2004 Antoniou ........... G05D 23/1917
236/12.12

(Continued)

OTHER PUBLICATIONS

International Search Report and Written Opinion—PCT/US2015/023638—ISA/EPO—Jun. 23, 2015.
(Continued)

*Primary Examiner* — Crystal J Barnes-Bullock
(74) *Attorney, Agent, or Firm* — Smith Tempel Blaha LLC

(57) ABSTRACT

A temperature of a component within the portable computing device (PCD) may be monitored along with a parameter associated with the temperature. The parameter associated with temperature may be an operating frequency, transmission power, or a data flow rate. It is determined if the temperature has exceeded a threshold value. If the temperature has exceeded the threshold value, then the temperature is compared with a temperature set point and a first error value is then calculated based on the comparison. Next, a first optimum value of the parameter is determined based on the first error value. If the temperature is below or equal to the threshold value, then a present value of the parameter is compared with a desired threshold for the parameter and a second error value is calculated based on the comparison. A second optimum value of the parameter may be determined based on the second error value.

22 Claims, 5 Drawing Sheets

(51) Int. Cl.
  *H01L 23/34* (2006.01)
  *G06F 1/32* (2006.01)
(52) U.S. Cl.
  CPC ............ *G06F 1/324* (2013.01); *G06F 1/3296* (2013.01); *H01L 23/34* (2013.01); *H01L 23/345* (2013.01); *Y02D 10/126* (2018.01)

(56) References Cited

U.S. PATENT DOCUMENTS

| | | | | |
|---|---|---|---|---|
| 7,606,566 B2* | 10/2009 | Ogoshi | ............... | H04M 1/66 |
| | | | | 348/208.16 |
| 7,761,274 B1 | 7/2010 | Pippin | | |
| 8,170,606 B2* | 5/2012 | Dorsey | ............... | H04B 1/036 |
| | | | | 370/311 |
| 8,374,730 B2* | 2/2013 | Conroy | ............... | G06F 1/206 |
| | | | | 361/679.02 |
| 8,392,340 B2* | 3/2013 | Cox | ............... | G06F 1/1677 |
| | | | | 706/12 |
| 8,762,097 B2* | 6/2014 | Millet | ............... | G06F 1/206 |
| | | | | 374/100 |
| 8,994,339 B1* | 3/2015 | Kam | ............... | H02J 7/0029 |
| | | | | 320/150 |
| 2007/0156370 A1 | 7/2007 | White et al. | | |
| 2009/0092261 A1 | 4/2009 | Bard | | |
| 2010/0169039 A1* | 7/2010 | Hosokawa | ............ | G06F 1/206 |
| | | | | 702/136 |
| 2011/0320161 A1* | 12/2011 | Dolbec | ............... | G06F 1/206 |
| | | | | 702/132 |
| 2012/0311357 A1 | 12/2012 | Andrews | | |
| 2013/0076381 A1 | 3/2013 | Takayanagi et al. | | |
| 2013/0081779 A1* | 4/2013 | Liao | ............... | G06F 1/203 |
| | | | | 165/11.1 |
| 2013/0228632 A1* | 9/2013 | Kapoor | ............ | G05D 23/1917 |
| | | | | 236/94 |
| 2013/0328890 A1 | 12/2013 | Avkarogullari et al. | | |
| 2014/0006818 A1 | 1/2014 | Doshi et al. | | |
| 2014/0365793 A1* | 12/2014 | Cox | ............... | G06F 1/206 |
| | | | | 713/320 |
| 2015/0060429 A1* | 3/2015 | Song | ............... | H01L 23/345 |
| | | | | 219/209 |
| 2015/0075186 A1* | 3/2015 | Prajapati | ............... | G06F 1/20 |
| | | | | 62/3.7 |

OTHER PUBLICATIONS

Yue J., et al., "Thermal-Aware Feedback Control Scheduling for Soft Real-time Systems," High Performance Computing and Communication & 2012 IEEE 9th International Conference on Embedded Software and Systems (HPCC-ICESS), 2012 IEEE 14th International Conference on, IEEE, Jun. 25, 2012 (Jun. 25, 2012), pp. 1479-1486, XP032255448, DOI: 19.1199//HPCC.2012.216 ISBN: 978-1-4673-2164-8 abstract I. Introduction—VI. TAFCS Algorithm figures 1-4.

* cited by examiner

METHOD AND SYSTEM FOR OPTIMIZING PERFORMANCE OF A PCD WHILE MITIGATING THERMAL GENERATION

STATEMENT REGARDING RELATED APPLICATIONS

This patent application claims priority under 35 U.S.C. § 119(e) to U.S Provisional Patent Application Ser. No. 61/973,772 filed Apr. 1, 2014, entitled, "METHOD AND SYSTEM FOR OPTIMIZING PERFORMANCE OF A PCD WHILE MITIGATING THERMAL GENERATION," the entire contents of which is hereby incorporated by reference.

DESCRIPTION OF THE RELATED ART

Portable computing devices ("PCDs") are becoming necessities for people. And optimal performance is desired for these battery operated devices. To achieve optimal performance, PCDs need to manage their internal temperature constantly. PCDs are battery operated devices and therefore, most PCDs do not have any active cooling devices, like fans. So PCDs use thermal mitigation algorithms. Thermal mitigation algorithms help in cooling a PCD passively when it gets hotter than a prescribed temperature threshold.

The thermal mitigation algorithms rely on embedded, on-die thermal sensors (TSENS) to obtain the instantaneous temperature of the various components (e.g., central processing unit ["CPU"] cores, graphics processing unit ["GPU"] cores, modems, etc.) present within a PCD. When any of the components heats up beyond a prescribed temperature, the thermal algorithms(s) are usually designed to throttle those components to reduce their heat generation.

The thermal mitigation algorithms(s) usually must be capable of adapting the device parameters to the heating characteristics of the device to effectively cool them down. At the same time, throttling the operating frequency of a CPU or GPU of a PCD may negatively impact the overall performance of the device. Similarly, throttling data rate and/or transmit power for modems of a PCD may also negatively impact the performance of the device.

Another problem experienced by PCDs include ones caused by battery current limitations ("CLs").CLs may occur when a particular component within a PCD draws a lot of current within a short time frame (of the order of microseconds) from the battery resulting in a voltage drop across critical components.

Unfortunately, certain critical components, such as memory, CPU, etc. inside the PCD require a minimum voltage to sustain their operation. When a component suddenly draws more power than it commonly does, the resulting voltage drop may result in a device failure (which may cause data erasures from the memory, device reboot, or in worst case, an overheated or permanently damaged device).

A CL situation may arise when, for instance, a CPU core of a PCD (such as a mobile phone) becomes more active when other cores are actively loaded, or a data call is initiated during a voice call, or the camera flash is activated while playing a game on the device. The CL situation may become worse when the battery charge is already low and/r when the temperature of the PCD rises.

Accordingly, what is needed in the art is a method and system for one or more algorithms that may mitigate thermal issues of a PCD while also minimizing the performance degradation experienced by the components due to throttling.

SUMMARY OF THE DISCLOSURE

A temperature of a component within the portable computing device (PCD) may be monitored along with a parameter associated with the temperature. The parameter associated with temperature may be an operating frequency, transmission power, or a data flow rate. It is determined if the temperature has exceeded a threshold value. If the temperature has exceeded the threshold value, then the temperature is compared with a temperature set point and a first error value is then calculated based on the comparison. Next, a first optimum value of the parameter is determined based on the first error value. If the temperature is below or equal to the threshold value, then a present value of the parameter is compared with a desired threshold for the parameter and a second error value is calculated based on the comparison. A second optimum value of the parameter may be determined based on the second error value.

The component of the PCD may be set to at least one of the first and second optimum values. The component may include at least one of a central processing unit, a core of a central processing unit, a graphical processing unit, a digital signal processor, a modem, and a RF-transceiver. The portable computing device may include at least one of a mobile telephone, a personal digital assistant, a pager, a smartphone, a navigation device, and a hand-held computer with a wireless connection or link.

BRIEF DESCRIPTION OF THE DRAWINGS

In the figures, like reference numerals refer to like parts throughout the various views unless otherwise indicated. For reference numerals with letter character designations such as "102A" or "102B", the letter character designations may differentiate two like parts or elements present in the same FIGURE. Letter character designations for reference numerals may be omitted when it is intended that a reference numeral to encompass all parts having the same reference numeral in all figures.

DETAILED DESCRIPTION

Figure 1:
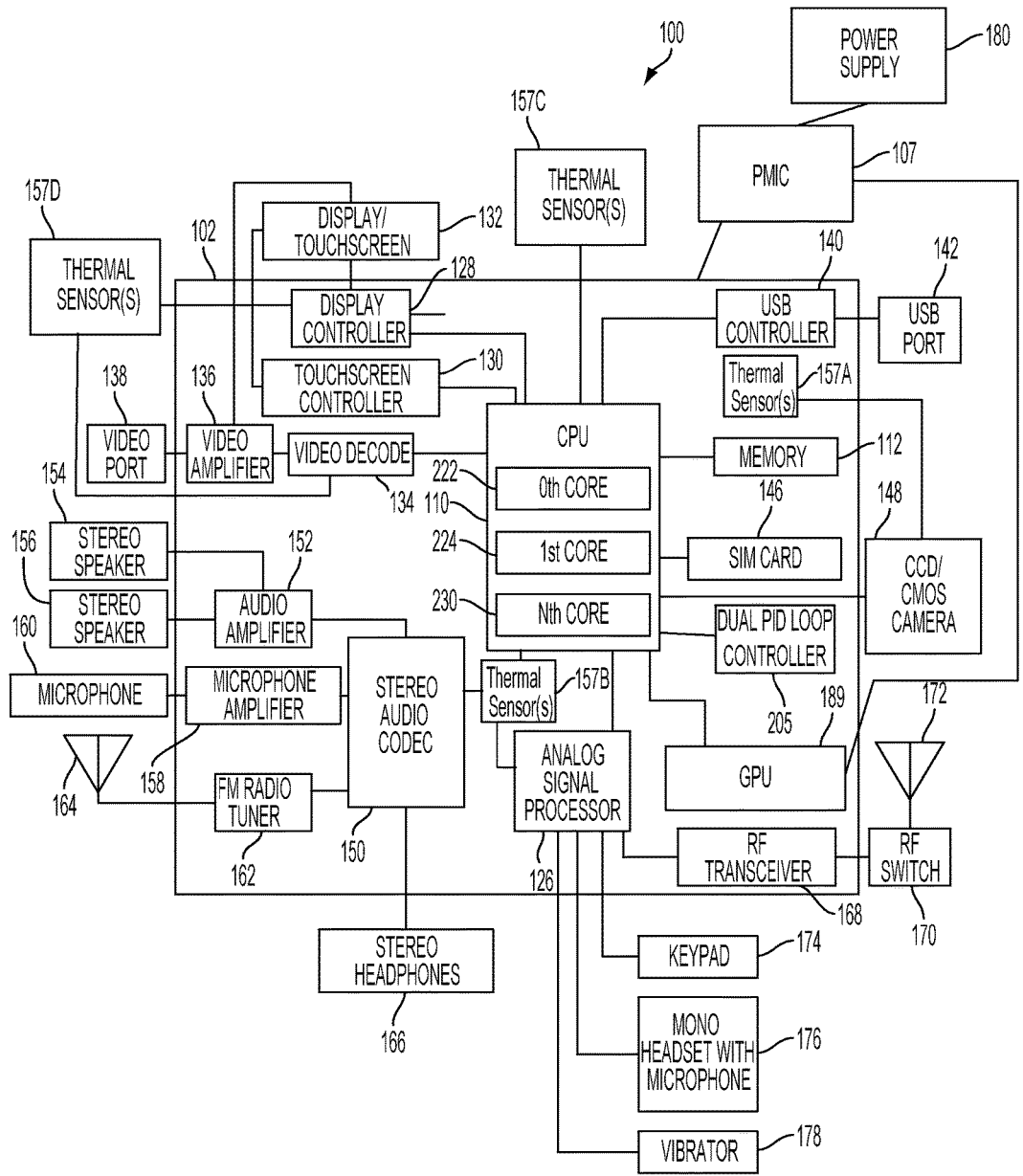
FIG. 1 is a functional block diagram illustrating an embodiment of a portable computing device ("PCD")

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone," "wireless communication device," and "wireless handset" are used interchangeably. With the advent of third generation ("3G") and fourth generation ("4G") wireless technology, greater bandwidth availability has enabled more portable computing devices with a greater variety of wireless capabilities.

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") wireless technology, have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, and a laptop computer with a wireless connection, among others.

Referring to FIG. 1, this figure is a functional block diagram of an exemplary, non-limiting aspect of a PCD 100 in the form of a wireless telephone for implementing methods and systems for optimizing performance of the PCD 100 and while mitigating thermal generation within the PCD 100. As shown, the PCD 100 includes an on-chip system 102 that includes a multi-core central processing unit ("CPU") 110 and an analog signal processor 126 that are coupled together. The CPU 110 may comprise a zeroth core 222, a first core 224, and an Nth core 230 as understood by one of ordinary skill in the art. Instead of a CPU 110, a digital signal processor ("DSP") may also be employed as understood by one of ordinary skill in the art.

The CPU 110 may also be coupled to one or more internal, on-chip thermal sensors 157A-B as well as one or more external, off-chip thermal sensors 157C-D. The on-chip thermal sensors 157A-B may comprise one or more proportional to absolute temperature ("PTAT") temperature sensors that are based on vertical PNP structure and are usually dedicated to complementary metal oxide semiconductor ("CMOS") very large-scale integration ("VLSI") circuits. The off-chip thermal sensors 157C-D may comprise one or more thermistors.

The thermal sensors 157 may produce a voltage drop (and/or a current) that is converted to digital signals with an analog-to-digital converter ("ADC") (not illustrated). However, other types of thermal sensors 157 may be employed without departing from the scope of this disclosure.

The PCD 100 of FIG. 1 may include and/or be coupled to a dual proportional integral derivative ("PID") loop controller 205. The dual PID loop controller 205 may comprise hardware, software, firmware, or a combination thereof. The dual PID loop controller 205 may be responsible for monitoring temperature of the PCD 100 and adjusting one or more parameters based on whether a temperature threshold or limit has been reached/achieved. Such parameters which may be adjusted include, but are not limited to, an operating frequency of a component such as the CPU 110, processor 126, and/or GPU 189; transmission power of the RF transceiver 168 which may comprise a modem; data rate or flow rates of the processor 126; as well as other parameters of the PCD 100 which may mitigate thermal generation and that may also impact operating performance of the PCD 100.

The dual PID loop controller 205 comprises two controllers (see FIG. 2A) which calculate separate error values relative to each other. One controller is provided with a temperature input while the other controller is provided with an input of an adjustable parameter. One interesting aspect of the dual PID loop controller 205 is that each PID controller has output that may control/impact the same adjustable parameter, such as operating frequency.

Figure 2A:
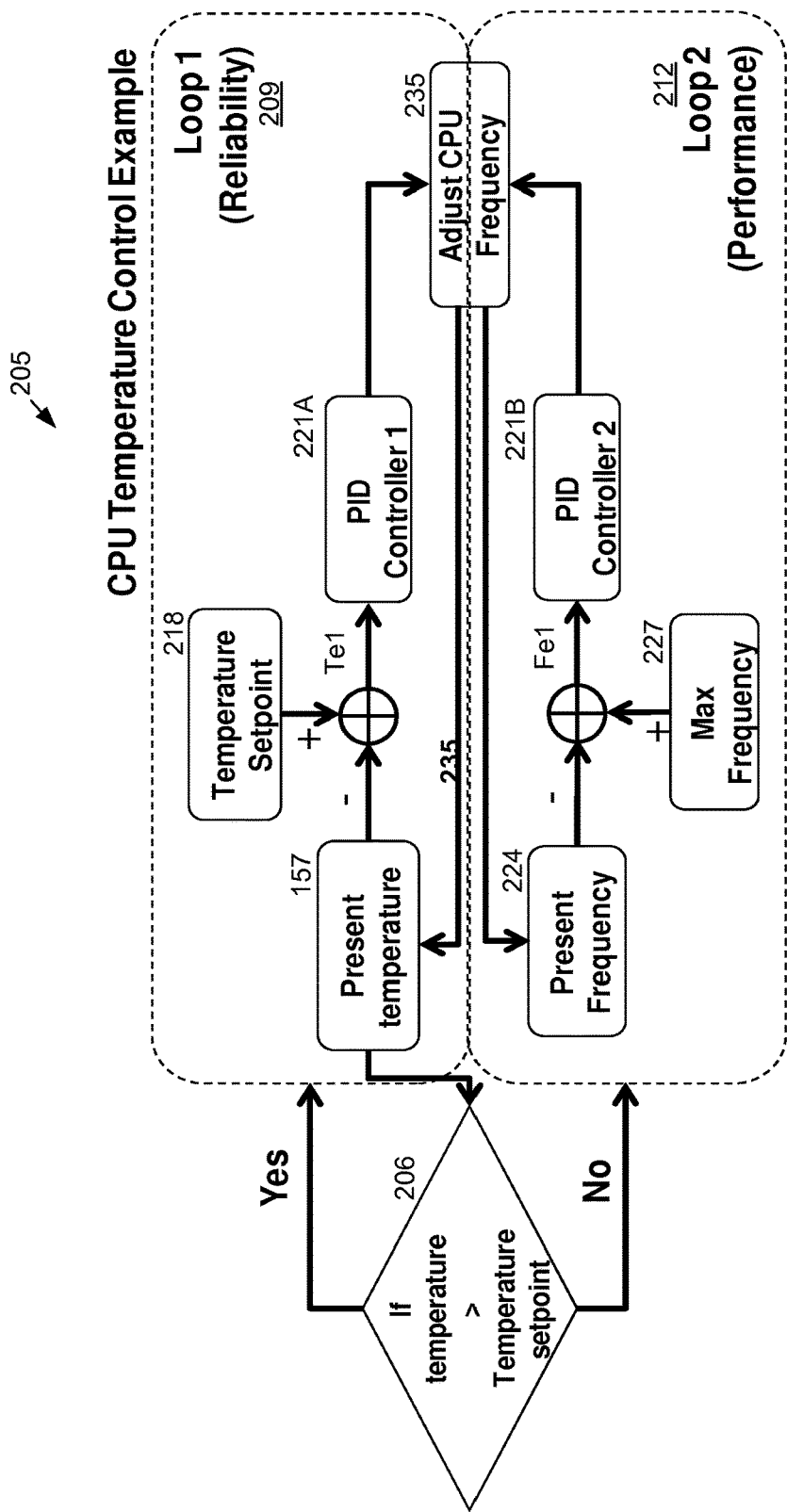
FIG. 2A is a functional block diagram illustrating details of the dual proportional integral derivative ("PID") loop controller for a CPU of the PCD of FIG. 1.

Further details of the dual PID loop controller 205 are described below in connection with FIG. 2A. The exemplary embodiment of the dual PID loop controller 205 of FIGS. 1 and 2A show the dual PID loop controller 205 for controlling the operating frequency of the CPU 110. However, as noted above, the dual PID loop controller 205 may be coupled and/or logically connected to any component and/or a plurality of components within the PCD 100. Further, the dual PID loop controller 205 may also adjust parameters other than operating frequency of a component, such as, but not limited to, transmission power, data flow rates, etc. as mentioned above.

In a particular aspect, one or more of the method steps for the dual PID loop controller 205 described herein may be implemented by executable instructions and parameters, stored in the memory 112, that may form software embodiments of the dual PID loop controller 205. These instructions that form the dual PID loop controller 205 may be executed by the CPU 110, the analog signal processor 126, or any other processor. Further, the processors, 110, 126, the memory 112, the instructions stored therein, or a combination thereof may serve as a means for performing one or more of the method steps described herein.

The power manager integrated controller ("PMIC") 107 may be responsible for distributing power to the various hardware components present on the chip 102. The PMIC is coupled to a power supply 180. The power supply 180, may comprise a battery and it may be coupled to the on-chip system 102. In a particular aspect, the power supply may include a rechargeable direct current ("DC") battery or a DC power supply that is derived from an alternating current ("AC") to DC transformer that is connected to an AC power source.

As illustrated in FIG. 1, a display controller 128 and a touchscreen controller 130 are coupled to the multi-core processor 110. A touchscreen display 132 external to the on-chip system 102 is coupled to the display controller 128 and the touchscreen controller 130.

FIG. 1 is a schematic diagram illustrating an embodiment of a portable computing device (PCD) that includes a video decoder 134. The video decoder 134 is coupled to the multicore central processing unit ("CPU") 110. A video amplifier 136 is coupled to the video decoder 134 and the touchscreen display 132. A video port 138 is coupled to the video amplifier 136. As depicted in FIG. 1, a universal serial bus ("USB") controller 140 is coupled to the CPU 110. Also, a USB port 142 is coupled to the USB controller 140. A memory 112 and a subscriber identity module (SIM) card 146 may also be coupled to the CPU 110.

Further, as shown in FIG. 1, a digital camera or camera subsystem 148 may be coupled to the CPU 110. In an exemplary aspect, the digital camera/cameral subsystem 148 is a charge-coupled device ("CCD") camera or a complementary metal-oxide semiconductor ("CMOS") camera.

As further illustrated in FIG. 1, a stereo audio CODEC 150 may be coupled to the analog signal processor 126. Moreover, an audio amplifier 152 may be coupled to the stereo audio CODEC 150. In an exemplary aspect, a first stereo speaker 154 and a second stereo speaker 156 are coupled to the audio amplifier 152. FIG. 1 shows that a microphone amplifier 158 may be also coupled to the stereo audio CODEC 150. Additionally, a microphone 160 may be coupled to the microphone amplifier 158.

In a particular aspect, a frequency modulation ("FM") radio tuner 162 may be coupled to the stereo audio CODEC 150. Also, an FM antenna 164 is coupled to the FM radio tuner 162. Further, stereo headphones 166 may be coupled to the stereo audio CODEC 150.

FIG. 1 further indicates that a radio frequency ("RF") transceiver 168 may be coupled to the analog signal processor 126. An RF switch 170 may be coupled to the RF transceiver 168 and an RF antenna 172. As shown in FIG. 1, a keypad 174 may be coupled to the analog signal processor 126. Also, a mono headset with a microphone 176 may be coupled to the analog signal processor 126. Further, a vibrator device 178 may be coupled to the analog signal processor 126.

As depicted in FIG. 1, the touchscreen display 132, the video port 138, the USB port 142, the camera 148, the first stereo speaker 154, the second stereo speaker 156, the microphone 160, the FM antenna 164, the stereo headphones 166, the RF switch 170, the RF antenna 172, the keypad 174, the mono headset 176, the vibrator 178, thermal sensors 157B, and the power supply 180 are external to the on-chip system 102.

Referring now to FIG. 2A, is a functional block diagram illustrating details of the dual proportional integral derivative ("PID") loop controller 205 for a CPU 110 of the PCD of FIG. 1. As noted above, the dual PID loop controller 205 may be implemented in software, hardware, firmware, or a combination thereof.

The dual PID loop controller 205 may comprise a temperature threshold block 206, a first control loop 209, and a second control loop 212. The first control loop 209 may control the adjustable parameter of a device when a first threshold is met, such as the operating frequency for a clock (not illustrated) of the CPU 110. Meanwhile, the second control loop 212 of the dual PID loop controller 205 may control the adjustable parameter of the device when a second threshold is met.

In the exemplary embodiment illustrated in FIG. 2A, the threshold condition/block 206 of the dual PID loop controller 205 is an operating temperature of a CPU 110 of the PCD 100. As noted previously, the dual PID loop controller 205 may control other devices besides a CPU 110. For example, the dual PID loop controller 205 may control the GPU 189, RF transceiver 168, and/or analog signal processor 126, or any other device of the PCD 100.

In the exemplary embodiment of FIG. 2A, if the temperature of the CPU 110 is greater than a predetermined threshold, then the "YES" branch of the threshold block 206 is followed to the first loop 209 in which the first loop 209 controls the adjustable parameter, which in this example is an operating frequency of the CPU 110.

Meanwhile, if the temperature of the CPU 110 is less than or equal to the predetermined threshold, then the "NO" branch of the threshold block 206 is followed to the second loop 212 in which the second loop 212 controls the adjustable parameter, which in this example is an operating frequency of the CPU 110.

The first loop 209 of the dual PID loop controller 205 may comprise a temperature input block 157, a desired temperature setpoint/target 218, and a first PID controller 221A. The temperature input block 157 may comprise outputs from any one or a plurality of temperature data generated and tracked by the thermal sensors 157 described above in connection with FIG. 1. The desired temperature setpoint/target 218 may comprise a desired maximum temperature for the CPU 110. This desired temperature setpoint/target 218 may be a fixed/set value and/or it may be dynamic meaning that it can be adjusted by one or more thermal mitigation algorithms/strategies which may be running concurrently relative to the dual PID loop controller 205.

The data from block 157 and block 218 and produces a temperature error value (Te1) which is provided as input to a first PID controller 221A. The first PID controller 221A uses the temperature error value (Te1) to calculate a frequency value by how much the operating frequency of the CPU 110 should be adjusted to reach the desired temperature setpoint/target 218. This frequency value which is the output of the first PID controller 221A is fed to an adjust CPU frequency block 235 where the operating frequency of the CPU 110 may be adjusted based on this frequency value. Further details of the first PID controller 221A will be described below.

Meanwhile, as noted above, if the temperature of the CPU 110 is less than or equal to the predetermined threshold, then the "NO" branch of the threshold block 206 is followed to the second loop 212 in which the second loop 212 controls the adjustable parameter, which in this example is an operating frequency of the CPU 110.

The second loop 212 may comprise a frequency input block 224, a desired max operating frequency 227, and a second controller 221B. The frequency input block 224 may comprise outputs from any one or a plurality of a clock frequency sensors or the clock itself (not illustrated) of the CPU 110.

As noted above, the second loop 212 may control another adjustable parameter besides frequency, such as transmission power, data flow rates, etc., which may impact thermal generation of the PCD 100. For the exemplary embodiment, the second loop 212 is designed to manage and control the operating frequency of the CPU 110 when a predetermined threshold is met.

The desired max operating frequency 227 of the second loop 212 may comprise a desired maximum operating frequency for the CPU 110. This desired maximum operating frequency 227 may be a fixed/set value and/or it may be dynamic meaning that it can be adjusted by one or more thermal mitigation algorithms/strategies and/or performance enhancing algorithms, such as a Dynamic Clock Voltage Scaling ("DCVS") algorithm, which may be running concurrently relative to the dual PID loop controller 205.

The data from block 224 and block 227 are compared and produce a frequency error value (Fe1) which is provided as input to a second PID controller 221B. The second PID controller 221B uses the frequency error value (Fe1) to calculate a frequency value by how much the operating frequency of the CPU 110 should be adjusted to reach the desired maximum operating frequency 227. This frequency value which is the output of the second PID controller 221B is fed to an adjust CPU frequency block 235 where the operating frequency of the CPU 110 may be adjusted based on this frequency value. Further details of the second PID controller 221B will be described below.

The two loops 209, 212 forming the dual PID loop controller 205 work in tandem relative to each other. In the illustrated exemplary embodiment of FIG. 2A, the first loop 209 is responsible for maintaining device reliability by throttling the parameters when temperature is greater than desired value in threshold block 206. Meanwhile, the second loop 212 is responsible for maintaining performance by adjusting the same parameters when temperature is less than the desired value in threshold block 206. Each loop 209, 212 has its own setpoint 218, 227 and input 157, 224, but the second loop 212 is active only when the first loop 209 is not active, and vice-versa.

Further, each loop 209, 212 has their own independent dynamics. This means that one loop error accumulations will not affect the other. Each PID controller 221A, 221B operates according to the following equation:

$$q(n) = K_p e(n) + K_i t_s \sum_{i=0}^{n} e(i) + \frac{K_d}{t_s}[e(n) - e(n-1)] \quad (EQ1)$$

Where q(n) is the output of the output of the PID controller proportional to the adjustment to be made at time n; Kp is a proportional error value constant, Ki is an integral error value constant; Kd is a derivative error value constant; e(n) is the error function defined by the difference between the parameter at time n and the desired setpoint; ts is the sampling duration; and i is the integration variable. The value of the contstants ("Ks") are determined by experiments and simulations, so that the PID controller output is stable and the setpoint intended is reached as quickly as possible with limited overshoots.

Equation EQ1 may lead to integral windup, which may comprise large overshoot in some instances. This may be avoided using the following velocity PID equation EQ2:

$$q(n)-q(n-1) \quad (EQ2)$$

where:

$$q(n) = q(n-1) + \{K_p[e(n) - e(n-1)] + K_i t_s e(n) + \frac{K_d}{t_s}|e(n) - 2e(n-1) + e(n-2)|\} \quad (EQ3)$$

q(n) is given by EQ1. Upon calculating q(n)−q(n−1) using EQ1, we arrive at EQ3.

Figure 2B:
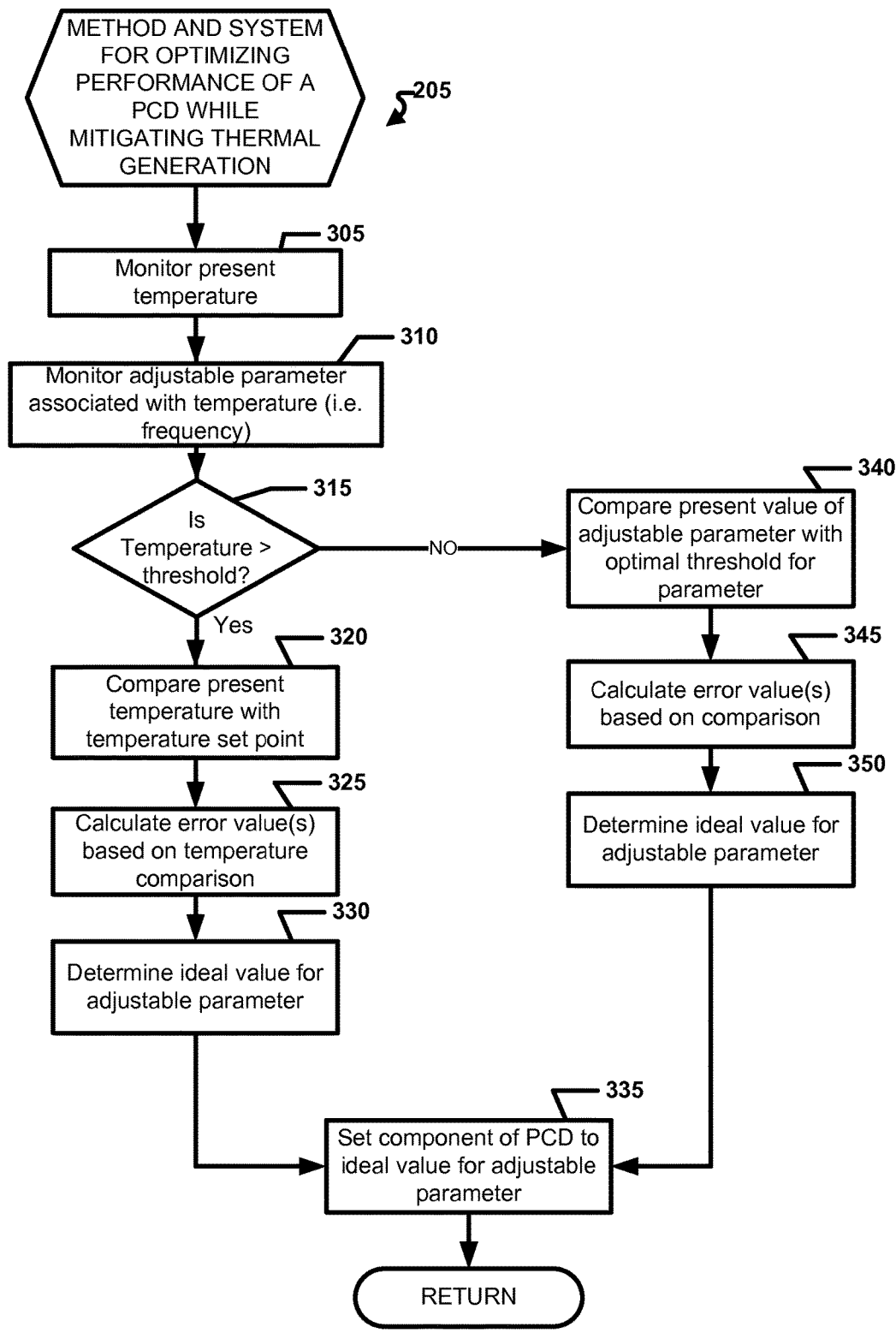
FIG. 2B is a logical flowchart illustrating a method for optimizing performance of the PCD and while mitigating thermal generation within the PCD.

FIG. 2B is a logical flowchart illustrating a method 205 for optimizing performance of the PCD 100 and while mitigating thermal generation within the PCD 100. FIG. 2B tracks the operations presented in FIG. 2A but in a more traditional, linear flow chart format.

Block 305 is the first block of the method 205. In block 305, the present temperature of a component within the PCD 100 is detected with a temperature sensor 157. As noted above, the dual PID loop controller 205 may be assigned to a single component, such as a CPU 110 or GPU 189. In other exemplary embodiments, a dual PID loop controller 205 may manage/control a plurality of components. In the embodiments in which a single component, like a CPU 110 is being managed by the dual PID loop controller 205, the temperature monitored in block 305 may be the temperature of the single component.

Next, block 310, a parameter associated with the temperature, such as frequency, may be monitored for the component of interest such as a CPU 110. According to one exemplary embodiment, the parameter may comprise clock frequency. However, as noted above, other adjustable parameters associated with temperature may include transmission power of the RF transceiver 168 which includes a modem; data rate or flow rates of the processor 126; as well as other parameters of the PCD 100 which may mitigate thermal generation and that may also impact operating performance of the PCD 100.

Subsequently, in decision block 315, the dual PID loop controller 205 determines if the temperature of a component or component(s) of interest have exceeded a predetermined threshold value. This predetermined threshold value may be established at manufacture of the component. For example, the threshold temperature value of a CPU 110 may have magnitude of about 90.0 degrees C. If the inquiry to decision block 315 is positive, then the "YES" branch is followed to block 320. If the inquiry to decision block 315 is negative, then the "NO" branch is followed to block 340.

In block 320, the PID controller 221A of loop 209 compares the present measured temperature (sensed in block 305) with the temperature setpoint 218 assigned to the component or components of interest. As noted previously in FIG. 2A, the temperature setpoint 218 may be a fixed value or it may change depending on one or more thermal mitigation algorithms which may be supported by the PCD 100.

Next, in block 325, the PID controller 221A of loop 209 in FIG. 2A, may calculate an error value (see Te1 of FIG. 2A) based on the comparison between the temperature setpoint 218 and the present temperature provided by a sensor 157. In block 330, the PID controller 221A of loop 209 may then determine an ideal operating frequency for the CPU 110 (the component of interest) based on the error values and equations EQ1 through EQ3.

Once the ideal operating frequency is calculated in block 330, then in block 335, the PID controller 221A of loop 209 may set the component of interest, such as the CPU 110, to the desired operating frequency which minimizes thermal generation by the component of interest which is the CPU 110 in this example. The method 205 then returns.

If the inquiry to decision block 315 is negative, then the "NO" branch is followed to block 340 in which the PID controller 221B of lower loop 212 compares the present value of the adjustable parameter 224, such as frequency which may be the present clock frequency, with maximum frequency 227 available for the component or components of interest. As noted above, the maximum frequency 227 may be set or it may be dynamic (changeable) depending on thermal mitigation algorithms which may be running in parallel with method 205.

Next, in block 345, the PID controller 221B of loop 212 may calculate error value(s) based on the comparison in block 340. Subsequently, the method continues to block 335 where the second PID controller 221B issues commands to the CPU 110 to adjust its operating frequency to the calculated ideal operating frequency. The method 205 then returns.

As noted previously, the dual PID loop controller 205 is not limited to the adjustable parameter of frequency. Other adjustable parameters include, but are not limited to, transmission power of the RF transceiver 168 which includes a modem; data rate or flow rates of the processor 126; as well as other parameters of the PCD 100 which may mitigate thermal generation and that may also impact operating performance of the PCD 100.

Figure 3:
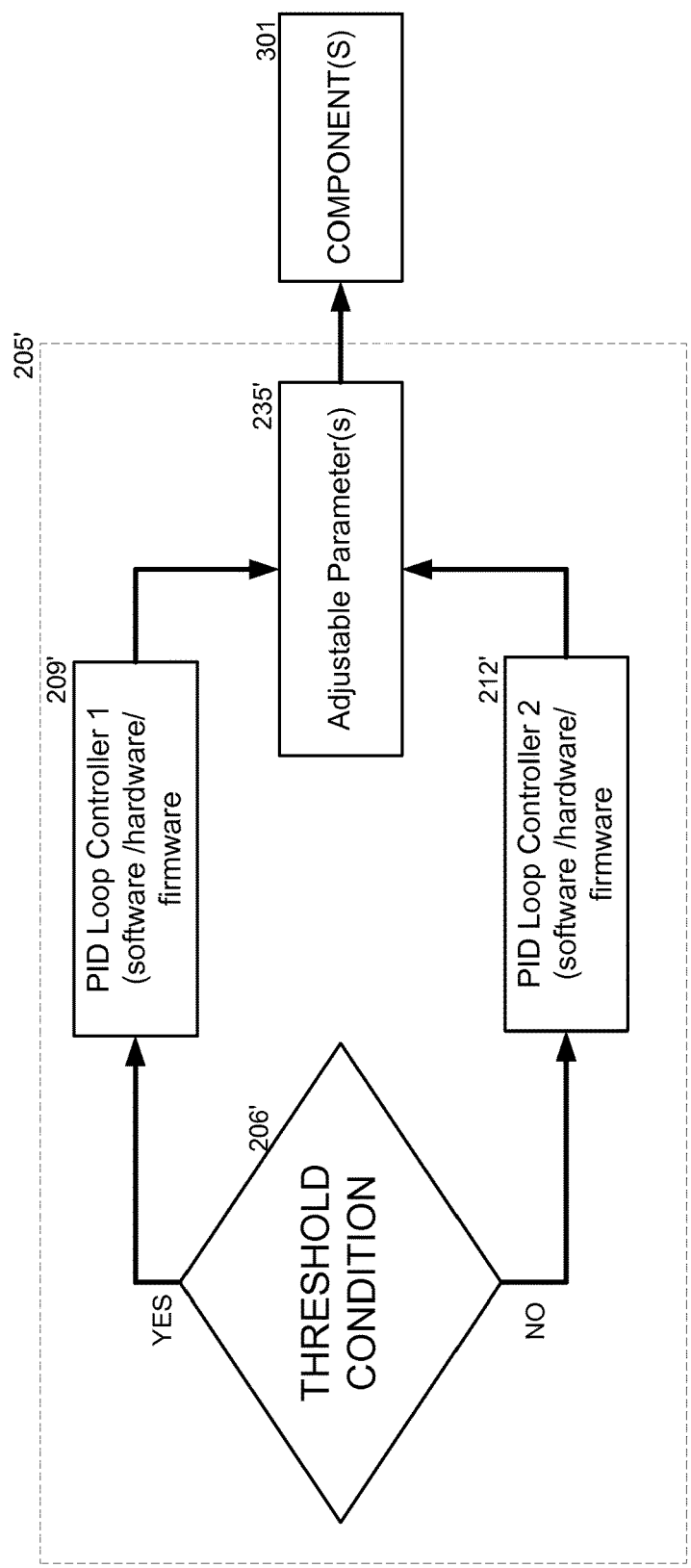
FIG. 3 is a functional block diagram of a generic dual PID loop controller for any component within the PCD of FIG. 1.

Referring now to FIG. 3, this figure is a functional block diagram of a generic dual PID loop controller 205' for any component within the PCD 100 of FIG. 1. In this exemplary embodiment, the dual PID loop controller 205' has a first loop 209' and a second loop 212' which are coupled together by a threshold condition 206'. In the earlier example, the threshold condition 206' may comprise temperature of a component or a plurality of components 301 controlled by the dual PID loop controller 205'.

Both the first loop 209' and second loop 212' may control as output an adjustable parameter 235', such as, but not limited to, an operating frequency. That adjustable parameter 235' is fed into a single component 301 or a plurality of components 301.

In the exemplary embodiment illustrated in FIG. 3, the first loop 209' of the dual PID loop controller 205' may comprise software, hardware, and/or firmware. Similarly, the second loop 212' of the dual PID loop controller 205' may comprise software, hardware, and/or firmware. Each loop 209, 212 may comprise a different structure which means that one loop may comprise software while the second loop comprises hardware, or vice-versa. In other embodiments, each loop 209, 212 may comprise the same structure, i.e. hardware-hardware, software-software, etc.

For some conditions, hardware embodiments of both loops 209, 212 may be the most practical design. For example, response times usually must be minimal to detect and to respond to electrical current limitations ("CLs"). For these conditions, both loops 209, 212 may comprise hardware. Exemplary hardware includes, but is not limited to, First-In/First-Out (FIFOs) type devices.

Meanwhile, component 301 may comprise a single component such as a CPU 110, a GPU 189, an analog signal processor 126, a digital signal processor, and other similar/like processing entities as understood by one of ordinary skill in the art. The component 301 may also comprise a plurality of devices in some exemplary embodiments instead of a device/component.

Figure 4:
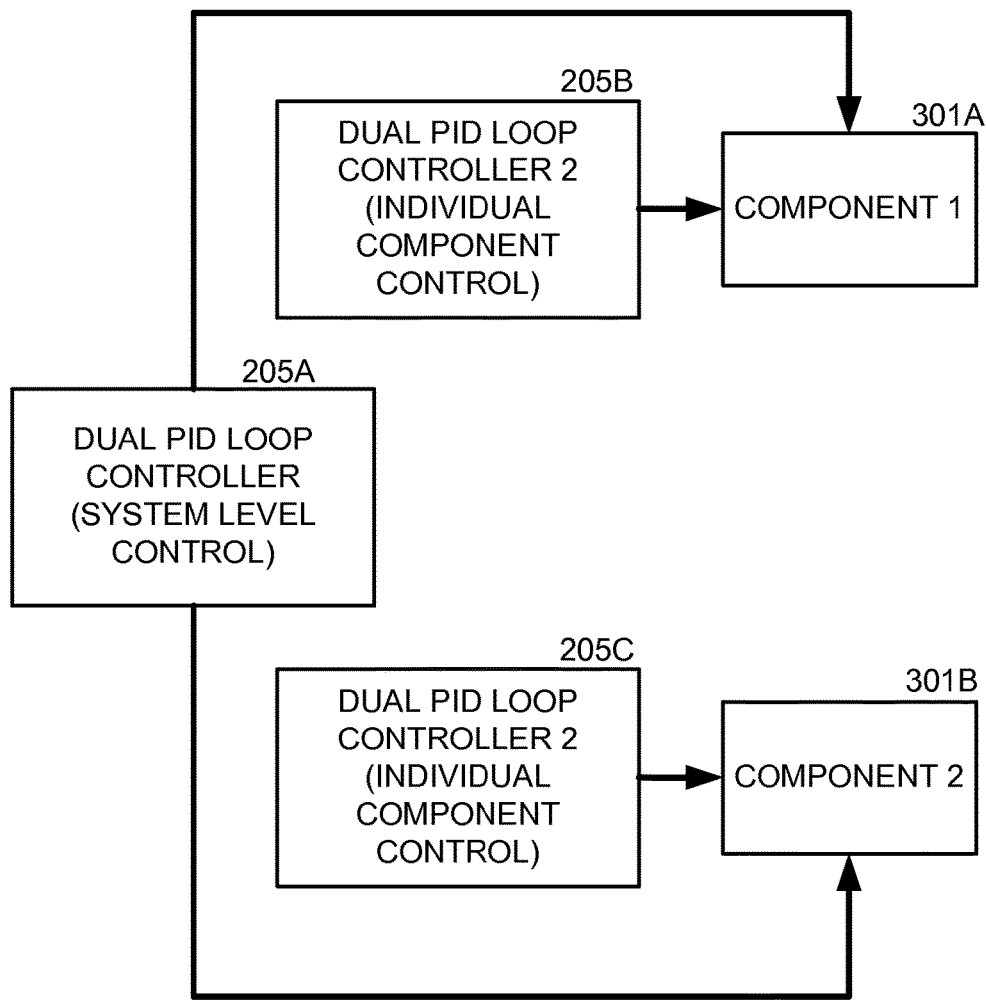
FIG. 4 is a functional block diagram of nested dual PID loop controllers that may be present within the PCD of FIG. 1.

FIG. 4 is a functional block diagram of nested dual PID loop controllers 205A, 205B, 205C that may be present within the PCD of FIG. 1. This diagram illustrates how multiple dual PID loop controllers 205A, 205B, 205C may be coupled to individual components 301A.

For example, a first component 301A may be controlled by dual (two) PID loop controllers 205A, 205B. Similarly, a second component 301B may be controlled by dual (two) PID loop controllers 205A, 205C. Other ways of nesting/grouping dual PID loop controllers 205A are possible and are included within the scope of this disclosure.

The dual PID loop controller 205 may maximize performance and reliability: reliability may be maintained by keeping an operating temperature below a setpoint, while performance may be achieved by allowing for a higher operational value once temperature is maintained below desired value. The dual PID controller 205 provides a flexible design where the algorithm design may be extended to any component in a PCD 100—by just varying the controlled and adjustable parameter, such as frequency.

The dual PID loop controller is adaptable: each of the PID loops 209, 212 may be tuned independently to achieve the level of aggressiveness desired in the control of the component 301. Dual PID loop controllers 205 offer stable operation in most operating conditions. The algorithm of the dual PID loop controllers 205 may achieve quicker convergence to desired temperatures and operational levels compared to single loop control of the conventional art.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium.

In the context of this document, a computer-readable medium is an electronic, magnetic, optical, or other physical device or means that may contain or store a computer program and data for use by or in connection with a computer-related system or method. The various logic elements and data stores may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" may include any means that may store, communicate, propagate, or transport the program for use by or in connection with the instruction execution system, apparatus, or device.

The computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random-access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, for instance via optical scanning of the paper or other medium, then compiled, interpreted or otherwise processed in a suitable manner if necessary, and then stored in a computer memory.

Computer-readable media include both computer storage media and communication media including any medium that facilitates transfer of a computer program from one place to another. A storage media may be any available media that may be accessed by a computer. By way of example, and not limitation, such computer-readable media may comprise any optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Therefore, although selected aspects have been illustrated and described in detail, it will be understood that various substitutions and alterations may be made therein without departing from the spirit and scope of the present invention, as defined by the following claims.

What is claimed is:

1. A method for optimizing operation of a portable computing device, comprising:
monitoring, by a first control loop, temperature of a processing component within the portable computing device;
monitoring, by a second control loop, a control parameter affecting thermal generation by the processing component and affecting performance of the portable computing device, the control parameter having a present value;
determining if the temperature has exceeded a threshold value; and
based on the temperature determination, applying a dual loop control scheme, wherein:
if the temperature has exceeded the threshold value, adjusting the control parameter in response to the first control loop based on a set point for the temperature; and
if the temperature is below or equal to the threshold value, adjusting the control parameter in response to the second control loop based on a target for the control parameter.

2. The method of claim 1, wherein the control parameter comprises at least one of operating frequency, transmission power, and a data flow rate.

3. The method of claim 1, wherein the target for the control parameter is set during manufacture of the portable computing device.

4. The method of claim 1, wherein the processing component comprises at least one of a central processing unit, a core of a central processing unit, a graphical processing unit, a digital signal processor, a modem, and a RF-transceiver.

5. The method of claim 1, wherein the method is applied individually to each of a plurality of processing components of the portable computing device.

6. The method of claim 5, wherein the plurality of processing components comprise one or more of a central processing unit, a core of a central processing unit, a graphical processing unit, a digital signal processor, a modem, and a RF-transceiver.

7. The method of claim 1, wherein the portable computing device comprises at least one of a mobile telephone, a personal digital assistant, a pager, a smartphone, a navigation device, and a hand-held computer with a wireless connection or link.

8. A computer system for optimizing operation of a portable computing device, the system comprising:
a processor operable for:
monitoring, by a first control loop, temperature of a processing component within the portable computing device;
monitoring, by a second control loop, a control parameter affecting thermal generation by the processing component and affecting performance of the portable computing device, the control parameter having a present value;
determining if the temperature has exceeded a threshold value; and
based on the temperature determination, applying a dual loop control scheme, wherein:
if the temperature has exceeded the threshold value, adjusting the control parameter in response to the first control loop based on a set point for the temperature; and
if the temperature is below or equal to the threshold value, adjusting the control parameter in response to the second control loop based on a target for the control parameter.

9. The system of claim 8, wherein the control parameter comprises at least one of operating frequency, transmission power, and a data flow rate.

10. The system of claim 8, wherein the target for the control parameter is set during manufacture of the portable computing device.

11. The system of claim 8, wherein the processing component comprises at least one of a central processing unit, a core of a central processing unit, a graphical processing unit, a digital signal processor, a modem, and a RF-transceiver.

12. The system of claim 8, wherein the processor is further operable for applying the recited steps individually to each of a plurality of processing components of the portable computing device.

13. The system of claim 12, wherein the plurality of processing components comprise one or more of a central processing unit, a core of a central processing unit, a graphical processing unit, a digital signal processor, a modem, and a RF-transceiver.

14. The system of claim 8, wherein the portable computing device comprises at least one of a mobile telephone, a personal digital assistant, a pager, a smartphone, a navigation device, and a hand-held computer with a wireless connection or link.

15. A computer system for optimizing operation of a portable computing device, the system comprising:
　　means for monitoring, by a first control loop, temperature of a processing component within the portable computing device;
　　means for monitoring, by a second control loop, a control parameter affecting thermal generation by the processing component and affecting performance of the portable computing device, the control parameter having a present value;
　　means for determining if the temperature has exceeded a threshold value; and
　　means for, based on the temperature determination, applying a dual loop control scheme, wherein:
　　　　if the temperature has exceeded the threshold value, adjusting the control parameter in response to the first control loop based on a set point for the temperature; and
　　　　if the temperature is below or equal to the threshold value, adjusting the control parameter in response to the second control loop based on a target for the control parameter.

16. The system of claim 15, wherein the control parameter comprises at least one of operating frequency, transmission power, and a data flow rate.

17. The system of claim 15, wherein the target for the control parameter is set during manufacture of the portable computing device.

18. A computer program product comprising a computer usable medium having a computer readable program code embodied therein, said computer readable program code adapted to be executed to implement a method for optimizing operation of a portable computing device, said method comprising:
　　monitoring, by a first control loop, temperature of a processing component within the portable computing device;
　　monitoring, by a second control loop, a control parameter affecting thermal generation by the processing component and affecting performance of the portable computing device, the control parameter having a present value;
　　determining if the temperature has exceeded a threshold value; and
　　based on the temperature determination, applying a dual loop control scheme, wherein:
　　　　if the temperature has exceeded the threshold value, adjusting the control parameter in response to the first control loop based on a set point for the temperature; and
　　　　if the temperature is below or equal to the threshold value, adjusting the control parameter in response to the second control loop based on a target for the control parameter.

19. The computer program product of claim 18, wherein the control parameter comprises at least one of operating frequency, transmission power, and a data flow rate.

20. The computer program product of claim 18, wherein the target for the control parameter is set during manufacture of the portable computing device.

21. The computer program product of claim 18, wherein the processing component comprises at least one of a central processing unit, a core of a central processing unit, a graphical processing unit, a digital signal processor, a modem, and a RF-transceiver.

22. The computer program product of claim 18, wherein the portable computing device comprises at least one of a mobile telephone, a personal digital assistant, a pager, a smartphone, a navigation device, and a hand-held computer with a wireless connection or link.

* * * * *